United States Patent
Lee

(10) Patent No.: US 10,634,622 B2
(45) Date of Patent: Apr. 28, 2020

(54) METHOD OF IDENTIFYING DEFECT REGIONS IN WAFER

(71) Applicant: SK SILTRON CO., LTD., Gumi-si, Gyeongsangbuk-do (KR)

(72) Inventor: Jae Hyeong Lee, Gumi-si (KR)

(73) Assignee: SK SILTRON CO., LTD., Gumi-si, Gyeongsangbuk-Do (KR)

(*) Notice: Subject to any disclaimer, the term of this patent is extended or adjusted under 35 U.S.C. 154(b) by 0 days.

(21) Appl. No.: 16/204,448

(22) Filed: Nov. 29, 2018

(65) Prior Publication Data

US 2019/0170661 A1   Jun. 6, 2019

(30) Foreign Application Priority Data

Dec. 6, 2017  (KR) .................. 10-2017-0166359

(51) Int. Cl.
*H01L 21/311*    (2006.01)
*G01N 21/95*    (2006.01)
(Continued)

(52) U.S. Cl.
CPC ..... *G01N 21/9505* (2013.01); *G01N 21/8803* (2013.01); *H01L 21/31116* (2013.01);
(Continued)

(58) Field of Classification Search
CPC .......... G01N 21/9505; G01N 21/8803; G01N 2021/8883; G01N 2021/8477;
(Continued)

(56) References Cited

U.S. PATENT DOCUMENTS 6,413,310 B1 * 7/2002 Tamatsuka .............. C30B 29/06
                                                                      117/3
9,176,073 B2 * 11/2015 Maekawa .............. G01N 21/93
(Continued)

FOREIGN PATENT DOCUMENTS

JP    S56-104799    8/1981
JP    H06-097251    4/1994
(Continued)

OTHER PUBLICATIONS

Korean Notice of Allowance dated Sep. 26, 2019 issued in Application No. 10-2017-0166359.
(Continued)

*Primary Examiner* — Savitri Mulpuri
(74) *Attorney, Agent, or Firm* — Ked & Associates, LLP

(57) ABSTRACT

A method of identifying a wafer defect region is disclosed. The method includes preparing a sample wafer, forming a primary oxide film on the sample wafer at a temperature of 800° C. to 1000° C., forming a secondary oxide film on the primary oxide film at a temperature of 1000° C. to 1100° C., forming a tertiary oxide film on the secondary oxide film at a temperature of 1100° C. to 1200° C., removing the primary to tertiary oxide films, etching one surface of the sample wafer from which the primary to tertiary oxide films are removed to form haze on one surface of the sample wafer, and identifying a defect region of the sample wafer based on the haze.

11 Claims, 4 Drawing Sheets

(51) Int. Cl.
  *G01N 21/88* (2006.01)
  *H01L 21/66* (2006.01)
  *G01N 21/84* (2006.01)
(52) U.S. Cl.
  CPC .............. *H01L 22/12* (2013.01); *H01L 22/24* (2013.01); *G01N 21/9501* (2013.01); *G01N 2021/8461* (2013.01); *G01N 2021/8477* (2013.01); *G01N 2021/8883* (2013.01)
(58) Field of Classification Search
  CPC ........ G01N 21/9501; G01N 2021/8461; H01L 22/24; H01L 22/12; H01L 21/31116
  See application file for complete search history.

(56) References Cited

U.S. PATENT DOCUMENTS

| | | | | |
|---|---|---|---|---|
| 10,325,823 | B2* | 6/2019 | Lee | ........................ H01L 21/324 |
| 2010/0290971 | A1* | 11/2010 | Itou | ........................ C30B 15/00 |
| | | | | 423/348 |
| 2011/0276299 | A1* | 11/2011 | Nemoto | ............. G01N 21/9501 |
| | | | | 702/104 |
| 2018/0088056 | A1* | 3/2018 | Shortt | .................... G01N 1/286 |
| 2018/0103247 | A1* | 4/2018 | Kolchin | ............. G01N 21/9505 |
| 2018/0149603 | A1* | 5/2018 | Bhattacharyya | ... G01N 21/9505 |

FOREIGN PATENT DOCUMENTS

| | | |
|---|---|---|
| JP | 2014-518196 | 7/2014 |
| JP | 2015-154065 | 8/2015 |
| KR | 10-2001-0031444 | 4/2001 |
| KR | 10-1616467 | 5/2016 |

OTHER PUBLICATIONS

Korean Office Action dated Mar. 21, 2019 issued in Application No. 10-2017-0166359.
Japanese Office Action dated Nov. 29, 2019 issued in Application No. 2018-220910.

\* cited by examiner

| Step | Temperature Range(℃) | Hold time (hrs) | THICKNESS(nm) | Remark |
|---|---|---|---|---|
| S120 | 850-900 | 1-4 | 16-35 | Nucleation |
| S130 | 950-1050 | 1-3 | 66-116 | Growth |
| S140 | 1100-1200 | 1-2 | 870-1150 | Interstitial Injection |

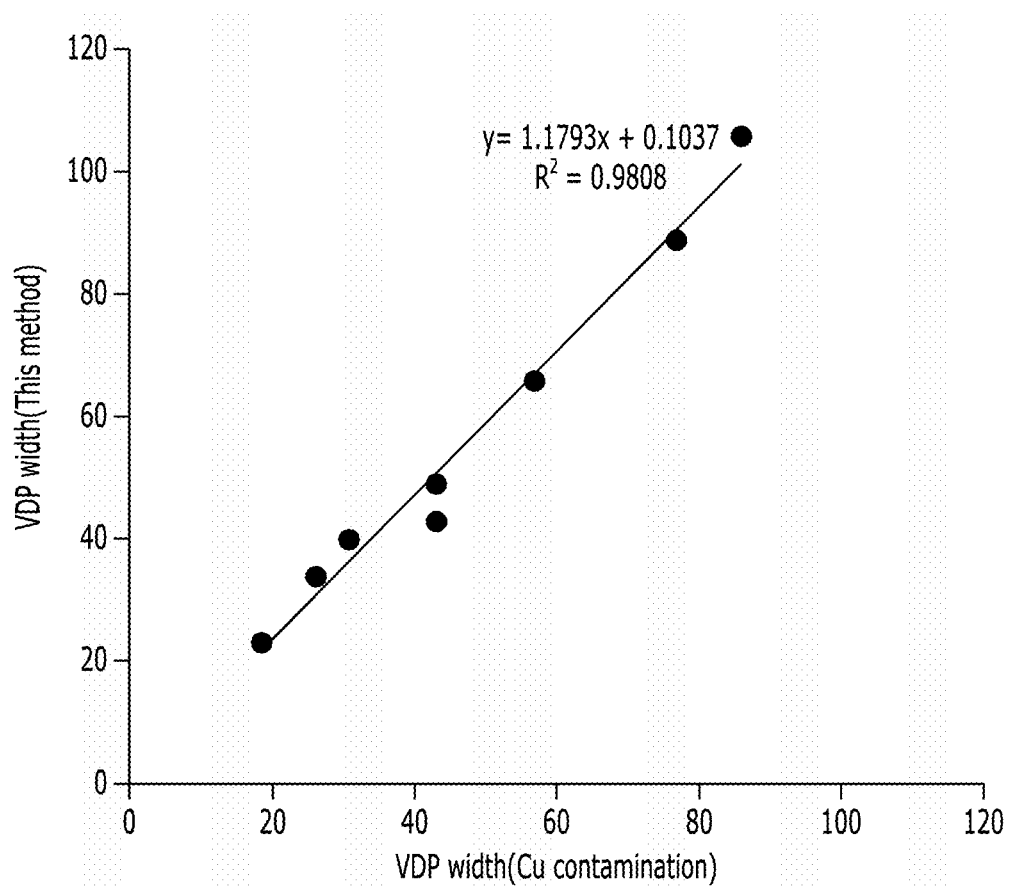

METHOD OF IDENTIFYING DEFECT REGIONS IN WAFER

This application claims the benefit of Korean Patent Application No. 10-2017-0166359, filed on Dec. 6, 2017, which is hereby incorporated by reference as if fully set forth herein.

BACKGROUND OF THE INVENTION

Field of the Invention

Embodiments relate to a method of identifying a defect region of a silicon wafer.

Discussion of the Related Art

With regard to single crystal silicon prepared using a CZ method, according to the Vorontsov theory related to tension velocity (V)/temperature gradient (G), the following crystal defect region may be generated depending on point defects generated during a growth procedure.

For example, in the case of high-speed growth in which single crystal silicon is grown with a threshold value of V/G or greater, a V-rich region in which void defects are present may be generated.

For example, in the case of low-speed growth in which single crystal silicon is grown with a threshold value of V/G or less, O-band in which oxidation induced stacking fault (OISF) defects are generated in the form of a ring in an edge or central region may be generated.

For example, when single crystal silicon is grown further slowly, a dislocation loop may become entangled and an I-rich region as a loop dominant point defect zone (LDP) defect region may be generated.

A zero-defect region in which point defects are not aggregated may be present between the V-rich region and the I-rich region.

The zero-defect region may be classified into a Pv region that is a vacancy dominant point defect (VDP) zero-defect region in which vacancy is dominant, and a Pi region that is an interstitial dominant point defect zone (IDP) zero-defect region in which self-interstitial is dominant according to the attributes of the included point defect.

Grown-in defects such as crystal originated particles (COP) and loop dominant point defect zone (LDP) in are associated directly with device failure and, thus, it is desirable to remove a wafer including a region with a high frequency of grown-in defects from a growth process.

A difference in oxygen precipitation force due to coexistence of the VDP and IDP defect regions may cause a difference in gettering ability due to metal contamination in a wafer to prevent device failure due to metal contamination and there is a problem in that the strength of the wafer is reduced due to reduction in a denuded zone and reduction residual Oi as oxygen is excessively precipitated.

Accordingly, it is desirable to control a grown-in defect region and, simultaneously, to pre-recognize distribution of point defects of a zero-defect region and, to also accurately differentiate between boundaries of O-band, a VDP region, and an IDP region.

In particular, according to a current trend in which a COP-free wafer is commercialized, an identification method has been developed to differentiate between boundaries of a zero-defect region including O-band as well as VDP and IDP.

SUMMARY OF THE INVENTION

An object of the embodiments is to provide a method of identifying a defect region of a wafer, for rapidly and simply differentiating between O-band, vacancy dominant point defect (VDP), and interstitial dominant point defect (IDP) zones of a crystal originated particles (COP)-free wafer.

Additional advantages, objects, and features of the embodiments will be set forth in part in the description which follows and in part will become apparent to those having ordinary skill in the art upon examination of the following or may be learned from practice of the embodiments. The objectives and other advantages of the embodiments may be realized and attained by the structure particularly pointed out in the written description and claims hereof as well as the appended drawings.

To achieve these objects and other advantages and in accordance with the purpose of the embodiments, as embodied and broadly described herein, a method of identifying a wafer defect region includes sample wafer includes preparing a sample wafer, forming a primary oxide film on the sample wafer at a temperature of 800° C. to 1000° C., forming a secondary oxide film on the primary oxide film at a temperature of 1000° C. to 1100° C., forming a tertiary oxide film on the secondary oxide film at a temperature of 1100° C. to 1200° C., removing the primary to tertiary oxide films, etching one surface of the sample wafer, from which the primary to tertiary oxide films are removed, to form haze on the one surface of the sample wafer, and identifying a defect region of the sample wafer based on the haze.

The primary oxide film and the secondary oxide film may be formed using a dry oxidation process and the tertiary oxide film may be formed using a wet oxidation process.

The secondary oxide film may have a greater thickness than a thickness of the primary oxide film and the tertiary oxide film may have a greater thickness than the thickness of the secondary oxide film.

In the identifying of the defect region of the sample wafer, the haze may include at least one of a white region and a black region, and a score based on an area of the white region of the sample wafer or an area of the black region may be assigned and the defect region of the sample wafer may be identified based on the assigned score.

In another aspect of the embodiments, a method of identifying a wafer defect region includes preparing a sample wafer, forming a primary oxide film on the sample wafer using a dry oxidation process in a first temperature hold period, the forming of the primary oxide film including a first temperature increase period in which temperature increases to a first target temperature and the first temperature hold period in which the first target temperature is maintained; forming a secondary oxide film on the primary oxide film using a dry oxidation process in a second temperature increase period and a second temperature hold period, the forming of the secondary oxide film including the second temperature increase period in which temperature increases to a second target temperature from the first target temperature and the second temperature hold period in which the target temperature is maintained, forming a tertiary oxide film on the secondary oxide film using a wet oxidation process in a third temperature increase period and a third temperature hold period, the forming of the tertiary oxide film including the third temperature increase period in which temperature increases to a third target temperature from the second target temperature and the third temperature hold period in which the third target temperature is maintained, removing the primary to tertiary oxide films, etching one surface of the sample wafer, from which the primary to tertiary oxide films are removed, to form haze on the one surface of the sample wafer, and identifying a defect region of the sample wafer based on the haze.

The first target temperature may be 850° C. to 900° C.

The second target temperature may be 950° C. to 1050° C.

The third target temperature may be 1100° C. to 1200° C.

A temperature increase inclination of the second temperature increase period and a temperature increase inclination of the third temperature increase period may each be 4° C./min to 6° C./min.

In the identifying of the defect region of the sample wafer, the haze may include at least one of a white region and a black region, and a score based on an area of the white region of the sample wafer or an area of the black region may be assigned and the defect region of the sample wafer may be identified based on the assigned score.

The method may further include performing a cooling process of reducing temperature to fourth target temperature from the third target temperature between the forming of the tertiary oxide film and the removing of the primary to tertiary oxide films.

The fourth target temperature may be 750° C. to 850° C. and an temperature reduction inclination in the cooling process may be 3° C./min to 10° C./min.

In another aspect of embodiments, a method of identifying a wafer defect region includes preparing a sample wafer, forming a primary oxide film on the sample wafer using a dry oxidation process at a first target temperature, forming a secondary oxide film on the primary oxide film using a dry oxidation process at a temperature between the first target temperature and a higher second target temperature than the first target temperature, forming a tertiary oxide film on the secondary oxide film using a wet oxidation process at a temperature between the second target temperature and a higher third target temperature than the second target temperature, removing the primary to tertiary oxide films, etching one surface of the sample wafer, from which the primary to tertiary oxide films are removed, to form haze on the one surface of the sample wafer, and identifying a defect region of the sample wafer based on the haze, wherein the first target temperature is 850° C. to 900° C., the second target temperature is 950° C. to 1050° C., and the third target temperature is 1100° C. to 1200° C.

BRIEF DESCRIPTION OF THE DRAWINGS

The accompanying drawings, which are included to provide a further understanding of the embodiments and are incorporated in and constitute a part of this application, illustrate embodiment(s) of the embodiments and together with the description serve to explain the principle of the embodiments. In the drawings:

FIG. 5 shows a relationship of vacancy dominant point defect (VDP) widths that are measured in the sample wafers of FIG. 4.

DETAILED DESCRIPTION OF THE INVENTION

Reference will now be made in detail to the preferred embodiments of the embodiments, examples of which are illustrated in the accompanying drawings.

In description of exemplary embodiments, it will be understood that, when an element is referred to as being "on" or "under" another element, the element can be directly on another element or intervening elements may be present. In addition, when an element is referred to as being "on" or "under" another element, this may include the meaning of an upward direction or a downward direction based on one component.

In addition, in the description of the various embodiments, although relative terms such as, for example, "first", "second", "on/upper/above" and "beneath/lower/below may be used to distinguish any one substance or element with another substance or element without requiring or containing any physical or logical relationship or sequence between these substances or elements. Wherever possible, the same reference numbers will be used throughout the drawings to refer to the same or like parts.

The term "comprises", "includes", or "has" described herein should be interpreted not to exclude other elements but to further include such other elements since the corresponding elements may be included unless mentioned otherwise. In addition, the term "correspond" described herein may include at least one of meaning of "oppose" or "overlap".

Figure 1:
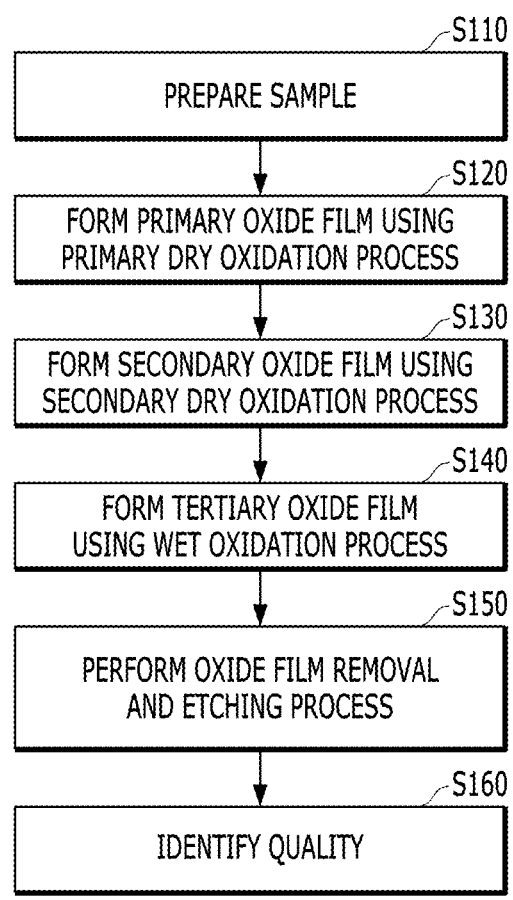
FIG. 1 is a flowchart of a method of identifying a defect region of a wafer according to an embodiment.

FIG. 1 is a flowchart of a method of identifying a defect region of a wafer according to an embodiment.

Referring to FIG. 1, the method of identifying a defect region of a wafer may include preparing a wafer sample (S110), forming a primary oxide film using a primary dry oxidation process (S120), forming a secondary oxide film using a secondary dry oxidation process (S130), forming a tertiary oxide film using a wet oxidation process (S140), performing an oxide film removal and etching process (S150), and performing an identification process (S160).

First, a wafer sample may be prepared (S110).

In this case, the prepared wafer sample may be a wafer for a semiconductor, which is obtained by growing a silicon single crystal ingot and performing an ingot grinding process, a cropping process, and a slicing process on the grown single crystal ingot.

Alternatively, the prepared wafer may be acquired by performing at least one of a lapping process, a grinding process, an etching process, and a polishing process on a surface of the wafer for a semiconductor.

Then, the primary dry oxidation process may be performed on the sample wafer to form the primary oxide film on the sample wafer (S120).

In the primary dry oxidation process, oxygen gas ($O_2$) may be injected into a reaction furnace (or a chamber) at a temperature of 800° C. to 1000° C. and the primary oxide film may be formed on the surface of the sample wafer using the injected oxygen gas (S120).

For example, the primary oxide film may have a thickness of 16 nm to 35 nm.

In the primary dry oxidation process, supersaturation of self-interstitial and nucleation of oxygen precipitates may occur. In a low temperature oxidation process, the supersaturated self-interstitial may be changed to a dislocation type defect in a high temperature process.

In addition, the oxygen precipitates may function as a sink of the supersaturated self-interstitial on an oxide-substrate interface after single crystal growth and, as a result, it may be possible to identify a point defect region by applying a difference in oxygen precipitation forces to whether interstitial defect is formed.

Then, in the secondary dry oxidation process, oxygen gas ($O_2$) may be injected to a reaction furnace (or a chamber) at a temperature of 1000° C. to 1100° C. and a secondary oxide film may be formed on the primary oxide film of the sample wafer using the injected oxygen gas (S130).

A time period for the secondary dry oxidation process may be longer than a time period for the primary dry oxidation process, without being limited thereto.

The thickness of the secondary oxide film may be greater than the thickness of the primary oxide film. For example, the secondary oxide film may have a thickness of 66 nm to 116 nm.

The secondary dry oxidation process may be a process in which oxygen precipitates are grown and recombination occurs in the grown oxygen precipitates through diffusion of self-interstitial.

In the secondary dry oxidation process, the oxygen precipitates may act as a recombination site of the self-interstitial and, thus, a boundary between an interstitial dominant point defect zone (IDP) and O-band/vacancy dominant point defect (VDP) on which oxygen is actively precipitated may be identified.

To provide a recombination site of the self-interstitial, oxygen precipitates need to be grown with a sufficient size and, thus, a time period for the secondary dry oxidation process may be longer than a time period for the primary dry oxidation process, without being limited thereto and, according to another embodiment, the two time periods may be the same or the time period for the secondary dry oxidation process may be shorter than the time period for the primary dry oxidation process.

A flow rate (or an amount of input) of oxygen gas in the secondary dry oxidation process may be the same as a flow rate (or an amount of input) of oxygen gas in the primary dry oxidation process, without being limited thereto.

Then, the wet oxidation process may be performed to form the secondary oxide film on the secondary oxide film (S140).

That is, oxygen gas ($O_2$) and hydrogen gas ($H_2$) may be injected into a reaction furnace (or a chamber) at a temperature of 1100° C. to 1200° C. and the tertiary oxide film may be formed on the secondary oxide film of the sample wafer using the injected oxygen gas and hydrogen gas (S140).

The thickness of the tertiary oxide film may be greater than the thickness of the secondary oxide film. For example, the tertiary oxide film may have a thickness of 870 nm to 1150 nm.

A process time for the wet oxidation process may be shorter than a process time of the primary dry oxidation process or may be shorter than a process time of the secondary dry oxidation process.

A flow rate of the oxygen gas in the wet oxidation process may be the same as a flow rate of the oxygen gas in each of the primary dry oxidation process and the secondary dry oxidation process.

In addition, a flow rate of the hydrogen gas in the wet oxidation process may be greater than a flow rate of the oxygen gas in the wet oxidation process. For example, in the wet oxidation process, the flow rate of the hydrogen gas may be 1 SLM to 6 SLM or the flow rate of the oxygen gas may be 1 SLM to 4 SLM.

In the wet oxidation process S140, the remaining supersaturated self-interstitial without recombination may be changed to a dislocation type defect in the primary dry oxidation process S120 and the secondary dry oxidation process S130, without being limited thereto.

Defects formed in the wet oxidation process may act as surface haze in the subsequent etching process S150 to enable visual analysis.

Figures 2, 3:
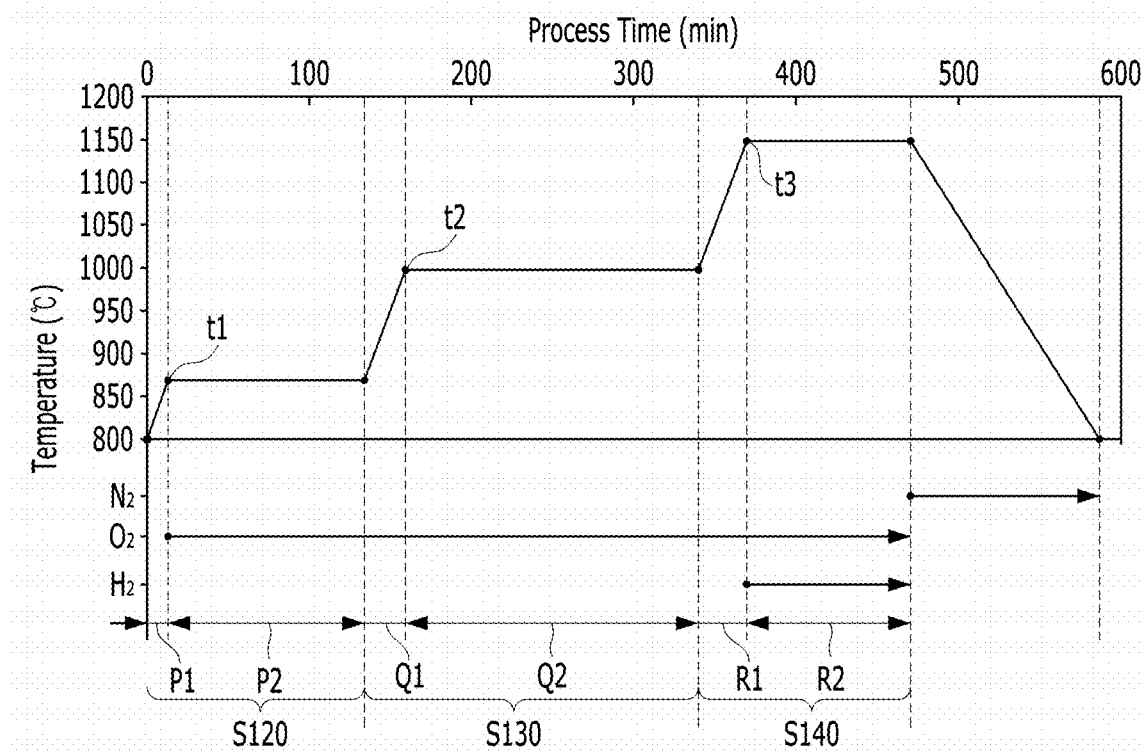
FIG. 2 illustrates a process condition of a primary dry oxidation process, a secondary dry oxidation process, and a wet oxidation process according to another embodiment.
FIG. 3 is a graph showing a process condition of a primary dry oxidation process, a secondary dry oxidation process, and a wet oxidation process according to another embodiment.

FIG. 2 illustrates a process condition of the primary dry oxidation process S120, the secondary dry oxidation process S130, and the wet oxidation process S140 according to another embodiment.

Referring to FIG. 2, a temperature condition of the primary dry oxidation process S120 may be 850° C. to 900° C. and a hold time for processing may be 1 hour to 4 hours. The formed primary oxide film may have a thickness of 16 nm to 35 nm.

A temperature condition of the secondary dry oxidation process S130 may be 950° C. to 1050° C., a hold time for processing may be 1 hour to 3 hours, and the secondary oxide film may have a thickness of 66 nm to 116 nm.

In addition, a temperature condition of the wet oxidation process S140 may be 1100° C. to 1200° C., a hold time for processing may be 1 hour to 2 hours, and the tertiary oxide film may have a thickness of 870 nm to 1150 nm.

FIG. 3 is a graph showing a process condition of the primary dry oxidation process S120, the secondary dry oxidation process S130, and the wet oxidation process S140 according to another embodiment.

In the graph, the x axis denotes a process time and the y axis denotes process temperature.

Referring to FIG. 3, the primary dry oxidation process S120 may include a first temperature increase period P1 and the first temperature hold period P2.

The first temperature increase period P1 may be a period in which temperature increases with a predetermined inclination in a state in which oxygen gas ($O_2$) is not injected and, in this case, the oxide film may not be formed on the sample wafer.

The first temperature increase period P1 may be a period in which temperature increases up to a first target temperature t1 from 800° C. For example, the first target temperature t1 may be 850° C. to 900° C. For example, the first target temperature t1 may be 870° C.

In the first temperature hold period P2, the first target temperature t1 may be maintained as process temperature and oxygen gas $O_2$ may be injected to form the primary oxide film.

The secondary dry oxidation process S130 may include a second temperature increase period Q1 and a second temperature hold period Q2.

In the second temperature increase period Q1, temperature may increase to a second target temperature t2 from the first target temperature t1.

For example, the second target temperature t2 may be 950° C. to 1050° C. For example, the second target temperature t2 may be 1000° C.

A temperature increase inclination of the second temperature increase period Q1 may be 4° C./min to 6° C./min. For example, the temperature increase inclination of the second temperature increase period Q1 may be 5° C./min.

A process time of the first temperature increase period P1 may be shorter than a process time of the second temperature increase period Q1. In addition, a process time of the first temperature hold period P2 may be longer than each of a process time of the first temperature increase period P1 and a process time of the second temperature increase period Q1.

In the second temperature hold period Q2, process temperature of the second target temperature t2 may be maintained and oxygen gas ($O_2$) may be injected to form the secondary oxide film.

The wet oxidation process S140 may include a third temperature increase period R1 and a third temperature hold period R2.

In the third temperature increase period R1, temperature may increase to a third target temperature t3 from the second target temperature t2.

For example, the third target temperature t3 may be 1100° C. to 1200° C. For example, the third target temperature t3 may be 1150° C.

A temperature increase inclination of the third temperature increase period R1 may be 4° C./min to 6° C./min. For example, a temperature increase inclination of the third temperature increase period R1 may be 5° C./min.

A temperature increase inclination of the third temperature increase period R1 may be the same as the temperature increase inclination of the second temperature increase period Q1, without being limited thereto. According to another embodiment, the temperature increase inclination of the third temperature increase period R1 may be greater than the temperature increase inclination of the second temperature increase period Q1 or vice versa, according to yet another embodiment.

In the third temperature hold period R2, process temperature may be maintained at the third target temperature t3 and oxygen gas ($O_2$) and hydrogen gas ($H_2$) may be injected to form the tertiary oxide film.

The process time of the first temperature hold period P2 may be shorter than the process time of the second temperature hold period Q2. The process time of the third temperature hold period R2 may be shorter than the process time of the first temperature hold period P2.

The process time of the first temperature hold period P2 may be 110 minutes to 150 minutes.

The process time of the second temperature hold period Q2 may be 160 minutes to 200 minutes.

The process time of the third temperature hold period R2 may be 80 minutes to 100 minutes.

For example, the process time of the first temperature hold period P2 may be 120 minutes, the process time of the second temperature hold period Q2 may be 180 minutes, and the process time of the third temperature hold period R2 may be 100 minutes.

The process time of the first temperature increase period P1 may be shorter than the process time of the second temperature increase period Q1 and the process time of the second temperature increase period Q1 may be equal to or less than the process time of the third temperature increase period R1.

Oxygen gas flow rates supplied in the first temperature hold period P2, the second temperature increase period Q1, the second temperature hold period Q2, the third temperature increase period R1, and the third temperature hold period R2 may be the same, without being limited thereto. According to another embodiment, in at least one of the above periods P2, Q1, Q2, R1, and R2, oxygen gas with a different flow rate from in the remaining periods may be supplied.

A flow rate of hydrogen gas in the third temperature hold period R2 may be greater than a flow gas of oxygen gas in the above periods P2, Q1, Q2, R1, and R2, without being limited thereto. According to another embodiment, a flow rate of hydrogen gas in the third temperature hold period R2 may be equal to or less than a flow rate of oxygen gas in the above periods P2, Q1, Q2, R1, and R2.

After the tertiary oxide film is formed using the wet oxidation process, the primary to tertiary oxide films formed on the sample wafer may be removed and one surface of the sample wafer from which the oxide films are removed may be etched to form haze for identification on a wafer surface (S150).

For example, the primary to tertiary oxide films may be removed from the sample wafer with the primary to tertiary oxide films formed thereon using a hydrofluoric acid (HF) solution. For example, the primary to tertiary oxide films may be removed through an HF strip process.

After the wet oxidation process, oxidation gas may not be injected, nitrogen gas may be injected, and a cooling process for lowering temperature may be performed at the third target temperature t3.

For example, in the cooling process, temperature may be lowered to a fourth target temperature from the third target temperature t3 and, in this case, a temperature reduction inclination may be 3° C./min to 10° C./min. For example, the temperature reduction inclination may be 3° C./min.

For example, the fourth target temperature may be 750° C. to 850° C. For example, the fourth target temperature may be 800° C.

Then, one surface of the sample wafer from which the primary to tertiary oxide films are removed may be etched via wet etching to form haze for identification of a point defect region on one surface of the sample wafer.

Then, a crystal defect region and the quality of the sample wafer may be identified via haze scoring with respect to the sample wafer with haze indicated thereon (S160).

For example, the haze may include at least one of a white region and a black region and a score based on an area (or width) of the white region, an area (or width) of the black region, or a ratio of the area (or width) of the white region to the area (or width) of the black region may be assigned to the sample wafer with haze indicated thereon.

For example, the white region may indicate a Pi region and the black region may indicate a Pv region.

For example, scoring may be performed on the Pi region of the white region or the Pv region of the black region.

For example, a score may be assigned to the white region or the black region by 10 points in units of predetermined lengths (e.g., 10 mm) in a direction toward an edge from the center of one surface of the wafer. A score with respect to the white region may be proportional to the area of the white region.

Whether the width of the vacancy dominant point defect (VDP) and the width of the interstitial dominant point defect zone (IDP) of the sample wafer are large or small may be identified based on the score assigned to the sample wafer and a boundary region between the VDP and the IDP may be identified.

Figure 4:
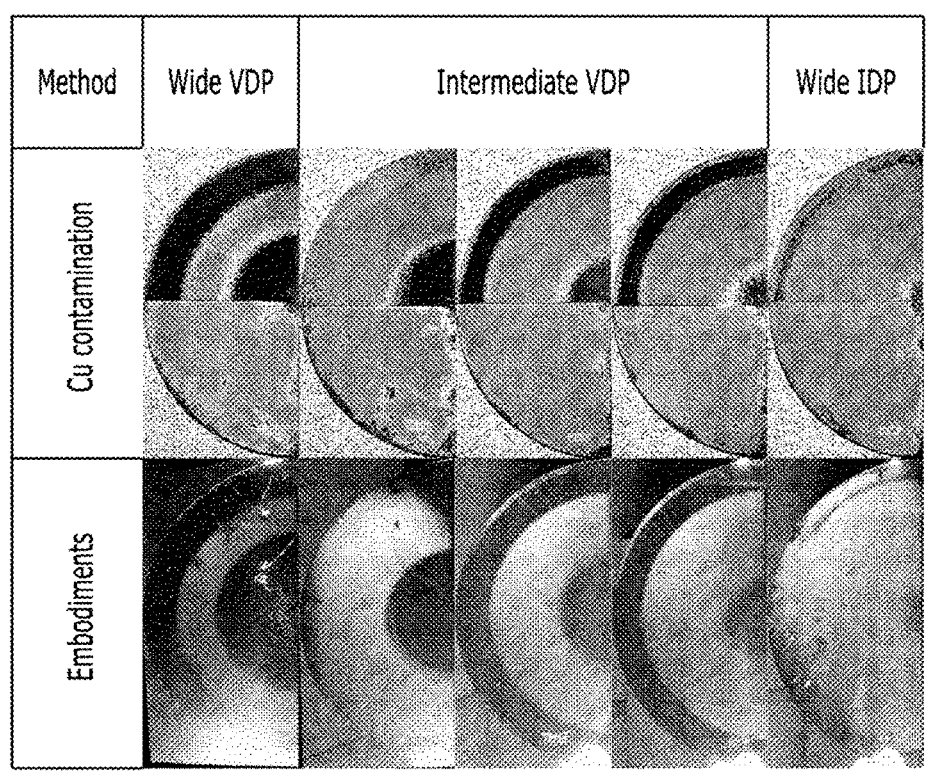
FIG. 4 shows a sample wafer prepared for identification using a copper (Cu) contamination method and a sample wafer formed using a method according to an embodiment.

FIG. 4 shows a sample wafer prepared for identification using a copper (Cu) contamination method and a sample wafer formed using a method according to an embodiment. FIG. 5 shows a relationship of VDP widths that are measured in the sample wafers of FIG. 4.

Referring to FIG. 4, the Cu contamination method and the method according to an embodiment may be applied to the same one silicon wafer sample that is extracted for each VDP width and each IDP width. A boundary of a point defect region may be visualized in the form of a white region on a highlight based on the application result of the Cu contamination method and the method according to an embodiment. Here, with regard the highlight, when light with high intensity is projected to one surface of a wafer, through which exposed via etching, if there is a defect region, light is scattered and flashes and is observed in the form of haze due to the defect region and the point defect region may be visualized through the highlight.

Here, the VDP region may be indicated as the black region and the IDP region may be indicated as the white region.

As shown in FIG. 4, the white region and the black region that are visualized using the method according to an embodiment may be similar to the white region and the black region that are visualized using the Cu contamination method. Accordingly, identification of a defect region based on haze acquired using the method according to an embodiment may achieve reliability corresponding to identification of the defect region based on the Cu contamination method.

That is, nucleation of oxygen precipitates may be performed via the primary dry oxidation process, growth and recombination of the oxygen precipitates may be performed via the secondary dry oxidation process, supersaturated self-interstitial may be changed to a dislocation type defect of the supersaturated self-interstitial via the wet oxidation process, haze for identification of the VDP and the IDP may be formed on one surface of the wafer through an oxide film removal and etching process, the formed haze may have a similar form to that of the white region and the black region acquired by the Cu contamination method, and it may be advantageous in that the conventional method of storing haze acquired using the Cu contamination method is applied without changes.

As seen from FIG. 5, the width of the VDP acquired using the Cu contamination method and the width of the VDP acquired using the method according to an embodiment may be similar.

A linear equation (y=1.1793X+0.1037) with respect to a straight plot represents an ideal trend line of the width of the VDP based on the Cu contamination method. In FIG. 5, $R^2$ represents approximation between widths of the VDP acquired using the method according to an embodiment and the linear equation.

It may be seen that an embodiment including the aforementioned operations S120 to S160 has a high correlation or relationship ($R^2>0.9$) with a method of identification of a point defect region using a Cu contamination method.

According to an embodiment, a wafer from which only surface damage is removed via mixed acid etching as well as a wafer formed by sawing a single crystal silicon to a predetermined thickness using a CZ method and, then, completing removal of surface damage and polishing may be input to a process and may be identified.

Accordingly, a point defect identification operation may be advanced to a time point immediately after an ingot is grown and, thus, an embodiment may reduce manufacturing cost and Cu materials. According to an embodiment, separate metal contamination may not be required for identification of point defect and, thus, it may not be necessary to prepare a metal contamination device and there may also be no worry about contamination of a reaction furnace due to metal.

According to an embodiment, a defect region of a wafer may be identified to rapidly and simply differentiate between the O-band, the VDP, and the IDP of a crystal originated particles (COP)-free wafer.

It will be apparent to those skilled in the art that various modifications and variations can be made in the embodiments without departing from the spirit or scope of the embodiments. Thus, it is intended that the embodiments cover the modifications and variations of the embodiments provided they come within the scope of the appended claims and their equivalents.

What is claimed is:

1. A method of identifying a wafer defect region, the method comprising:
   preparing a sample wafer;
   forming a primary oxide film on the sample wafer at a temperature of 800° C. to 1000° C.;
   forming a secondary oxide film on the primary oxide film at a temperature of 1000° C. to 1100° C.;
   forming a tertiary oxide film on the secondary oxide film at a temperature of 1100° C. to 1200° C.;
   removing the primary to tertiary oxide films;
   etching one surface of the sample wafer, from which the primary to tertiary oxide films are removed, to form haze on the one surface of the sample wafer; and
   identifying a defect region of the sample wafer based on the haze, wherein:
   in the identifying of the defect region of the sample wafer, the haze includes at least one of a white region and a black region; and
   a score based on an area of the white region of the sample wafer or an area of the black region is assigned and the defect region of the sample wafer is identified based on the assigned score.

2. The method of claim 1, wherein the primary oxide film and the secondary oxide film are formed using a dry oxidation process and the tertiary oxide film is formed using a wet oxidation process.

3. The method of claim 1, wherein:
   the secondary oxide film has a greater thickness than a thickness of the primary oxide film; and
   the tertiary oxide film has a greater thickness than the thickness of the secondary oxide film.

4. A method of identifying a wafer defect region, the method comprising:
   preparing a sample wafer;
   forming a primary oxide film on the sample wafer using a dry oxidation process in a first temperature hold period, the forming of the primary oxide film including a first temperature increase period in which temperature increases to a first target temperature and the first temperature hold period in which the first target temperature is maintained;
   forming a secondary oxide film on the primary oxide film using a dry oxidation process in a second temperature increase period and a second temperature hold period, the forming of the secondary oxide film including the second temperature increase period in which temperature increases to a second target temperature from the first target temperature and the second temperature hold period in which the target temperature is maintained;
   forming a tertiary oxide film on the secondary oxide film using a wet oxidation process in a third temperature increase period and a third temperature hold period, the forming of the tertiary oxide film including the third temperature increase period in which temperature increases to a third target temperature from the second target temperature and the third temperature hold period in which the third target temperature is maintained;
   removing the primary to tertiary oxide films;

etching one surface of the sample wafer, from which the primary to tertiary oxide films are removed, to form haze on the one surface of the sample wafer; and identifying a defect region of the sample wafer based on the haze, wherein:

in the identifying of the defect region of the sample wafer, the haze includes at least one of a white region and a black region; and a score based on an area of the white region of the sample wafer or an area of the black region is assigned and the defect region of the sample wafer is identified based on the assigned score.

5. The method of claim 4, wherein the first target temperature is 850° C. to 900° C.

6. The method of claim 5, wherein the second target temperature is 950° C. to 1050° C.

7. The method of claim 6, wherein the third target temperature is 1100° C. to 1200° C.

8. The method of claim 4, wherein a temperature increase inclination of the second temperature increase period and a temperature increase inclination of the third temperature increase period are each 4° C./min to 6° C./min.

9. The method of claim 4, further comprising performing a cooling process of reducing temperature to fourth target temperature from the third target temperature between the forming of the tertiary oxide film and the removing of the primary to tertiary oxide films.

10. The method of claim 9, wherein the fourth target temperature is 750° C. to 850° C. and an temperature reduction inclination in the cooling process is 3° C./min to 10° C./min.

11. A method of identifying a wafer defect region, the method comprising:

preparing a sample wafer;

forming a primary oxide film on the sample wafer using a dry oxidation process at a first target temperature;

forming a secondary oxide film on the primary oxide film using a dry oxidation process at a temperature between the first target temperature and a higher second target temperature than the first target temperature;

forming a tertiary oxide film on the secondary oxide film using a wet oxidation process at a temperature between the second target temperature and a higher third target temperature than the second target temperature;

removing the primary to tertiary oxide films;

etching one surface of the sample wafer, from which the primary to tertiary oxide films are removed, to form haze on the one surface of the sample wafer; and identifying a defect region of the sample wafer based on the haze, wherein the first target temperature is 850° C. to 900° C., the second target temperature is 950° C. to 1050° C., and the third target temperature is 1100° C. to 1200° C., wherein:

in the identifying of the defect region of the sample wafer, the haze includes at least one of a white region and a black region; and a score based on an area of the white region of the sample wafer or an area of the black region is assigned and the defect region of the sample wafer is identified based on the assigned score.

* * * * *